(12) United States Patent
Gauthier et al.

(10) Patent No.: US 6,687,881 B2
(45) Date of Patent: Feb. 3, 2004

(54) METHOD FOR OPTIMIZING LOOP BANDWIDTH IN DELAY LOCKED LOOPS

(75) Inventors: Claude Gauthier, Fremont, CA (US); Brian Amick, Austin, TX (US); Dean Liu, Sunnyvale, CA (US); Pradeep Trivedi, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/075,782

(22) Filed: Feb. 14, 2002

(65) Prior Publication Data

US 2003/0154447 A1 Aug. 14, 2003

(51) Int. Cl.⁷ .............................................. G06F 17/50
(52) U.S. Cl. .............................. 716/2; 716/3; 716/18; 327/147; 327/150
(58) Field of Search ........................ 716/1–6, 18, 19; 327/147–150, 156–157; 331/14, 25, 16; 324/76.53, 76.39, 71.4, 76.82

(56) References Cited

U.S. PATENT DOCUMENTS

| | | | | | |
|---|---|---|---|---|---|
| 6,125,157 | A | * | 9/2000 | Donnelly et al. | 375/371 |
| 6,229,363 | B1 | * | 5/2001 | Eto et al. | 327/158 |
| 6,411,142 | B1 | * | 6/2002 | Abbasi et al. | 327/156 |
| 6,437,650 | B1 | * | 8/2002 | Sung et al. | 331/25 |
| 6,476,656 | B2 | * | 11/2002 | Dally et al. | 327/276 |
| 6,483,358 | B2 | * | 11/2002 | Ingino, Jr. | 327/157 |
| 6,539,072 | B1 | * | 3/2003 | Donnelly et al. | 375/371 |

* cited by examiner

*Primary Examiner*—Vuthe Siek
*Assistant Examiner*—Binh C. Tat
(74) *Attorney, Agent, or Firm*—Rosenthal & Osha L.L.P.

(57) ABSTRACT

A method for optimizing loop bandwidth in a delay locked loop is provided. A representative power supply waveform having noise is input into a simulation of the delay locked loop; an estimate of jitter is determined; and the loop bandwidth of the delay looked loop is adjusted until the jitter falls below a pre-selected value. Further, a computer system for optimizing loop bandwidth in a delay locked loop is provided. Further, a computer-readable medium having recorded thereon instructions adapted to optimize loop bandwidth in a delay locked loop is provided.

36 Claims, 7 Drawing Sheets

METHOD FOR OPTIMIZING LOOP BANDWIDTH IN DELAY LOCKED LOOPS

BACKGROUND OF INVENTION

To increase processor performance, clock frequencies used by microprocessors, often referred to as "CPUs", have increased. Also, as the number of circuits that can be used in a CPU has increased, the number of parallel operations has risen. Examples of efforts to create more parallel operations include increased pipeline depth and an increase in the number of functional units in super-scalar and very-long-instruction-word architectures. As processor performance continues to increase, the result has been a larger number of circuits switching at faster rates. Thus, from a design perspective, important considerations, such as power, switching noise, and signal integrity must be taken into account.

Higher frequencies for an increased number of circuits also increase switching noise on the power supply. If the components responsible for carrying out specific operations do not receive adequate power in a timely manner, computer system performance is susceptible to degradation. The switching noise may have a local or global effect. Circuits that create large amounts of noise may be relatively isolated; however, they may also affect other circuits, possibly involving very complex interactions between the noise generation and the function of affected circuits. Thus, providing power to the components in a computer system in a sufficient and timely manner has become an issue of significant importance.

As the frequencies of modern computers continue to increase, the need to rapidly transmit data between chip interfaces also increases. To accurately receive data, a clock is often sent to help recover the data. The clock determines when the data should be sampled by a receiver's circuits.

The clock may transition at the beginning of the time the data is valid. The receiver would prefer, however, to have a signal during the middle of the time the data is valid. Also, the transmission of the clock may degrade as it travels from its transmission point. In both circumstances, a delay locked loop, or DLL, can regenerate a copy of the clock signal at a fixed phase shift from the original.

FIG. 1 shows a section of a typical computer system component (10). Data (22) that is 'n' bits wide is transmitted from circuit A (20) to circuit B (40). To aid in the recovery of the transmitted data, a clock composed of a clock signal (30), or CLK, is also transmitted with the data. The circuits could also have a path to transmit data from circuit B (40) to circuit A (20) along with an additional clock (not shown). The clock signal (30) may transition from one state to another at the beginning of the data transmission. Circuit B (40) requires a signal temporally located some time after the beginning of the valid data. Furthermore, the clock signal (30) may have degraded during transmission. The DLL has the ability to regenerate the clock signal (30) to a valid state and to create a phase shifted version of the clock to be used by other circuits, for example, a receiver's sampling signal. The receiver's sampling signal determines when the input to the receiver should be sampled.

One common performance measure for a DLL is jitter. Jitter is the time domain error from poor spectral purity of an output. In other words, the output plus a known phase shift, should track the input. In a repeated output pattern, such as a clock signal, a transition that occurs from one state to another that does not happen at the same time relative to other transitions is said to have jitter. Jitter is related to power supply noise.

Delay locked loops are basically first order feedback control systems. As such, the delay locked loop can be described in the frequency domain as having a loop gain and a loop bandwidth. The loop bandwidth is the speed at which a signal completes the feedback loop of the delay locked loop to produce an update (i.e., error signal). Ideally, the DLL should have the highest possible bandwidth so that the clock and data track each other. Power supply noise will, however, have a certain noise-versus-frequency characteristic that may require the loop bandwidth to be reduced to attenuate the effects of the power supply noise. The loop bandwidth determines to a large degree what portion of power supply noise is translated to output jitter.

Often, power supplied to a computer system component varies due to switching by active circuits, which in turn, affects the integrity of the component's output. Typically, this power variation results from parasitic inductance and/or resistance between a power supply for the component and the component itself. These effects may lead to the component not receiving power (via current) at the exact time it is required. If the components responsible for carrying out specific operations do not receive adequate power in a timely manner, computer system performance is susceptible to degradation.

FIG. 2 shows a section of a typical power supply network (100) of a computer system. The power supply network (100) may be representative of a single integrated circuit, or "chip", or equally an entire computer system comprising multiple integrated circuits. The power supply network (100) has a power supply (112) that includes a power supply line (114) and a ground line (116) through an impedance network $Z_1$ (118). Impedance networks are a collection of passive elements that result from inherent resistance, capacitance, and/or inductance of physical connections. A power supply line (122, 123) and a ground line (124, 125) facilitate power supply to a circuit A (120) and circuit B (126), respectively. Power supply line (123) and ground line (125) also supply circuit C (130) through another impedance network $Z_2$ (128) and additional impedance networks and circuits, such as impedance network $Z_n$ (132) and circuit N (134). The impedance networks and connected circuits may be modeled in simulation so that the designer can better understand the behavior of how the circuits interact.

Still referring to FIG. 2, circuit A (120), circuit B (126), circuit C (130), and circuit N (134) may be analog or digital circuits. Also, circuit A (120), circuit B (126), circuit C (130), and circuit N (134) may generate and/or be susceptible to power supply noise. For example, circuit C (130) may generate a large amount of power supply noise that affects the operation of both circuit B (126) and circuit N (134). The designer, in optimizing the performance of circuit B (126) and circuit N (134), requires an understanding of the characteristics of the power supply noise.

SUMMARY OF INVENTION

According to one aspect of the present invention, a method for optimizing loop bandwidth in a delay locked loop comprises inputting a representative power supply waveform having noise to a simulation of the delay locked loop, estimating jitter of the delay locked loop, adjusting the loop bandwidth of the delay locked loop, and repeating the inputting, estimating, and adjusting until the jitter falls below a selected amount.

According to another aspect of the present invention, a computer system for optimizing loop bandwidth in a delay locked loop comprises a processor, a memory, and software instructions stored in the memory adapted to cause the computer system to input a representative power supply waveform having noise into a simulation of the delay locked loop, estimate jitter of the delay locked loop, adjust the loop bandwidth of the delay locked loop, and repeat the input, estimate, and adjust until the jitter falls below a selected amount.

According to another aspect of the present invention, a computer-readable medium that has recorded instructions thereon executable by a processor, where the instructions are adapted to input a representative power supply waveform having noise into a simulation of a delay locked loop, estimate jitter of the delay locked loop, adjust the loop bandwidth of the delay locked loop, and repeat the input, estimate, and adjust until the jitter falls below a selected amount.

Other aspects and advantages of the invention will be apparent from the following description and the appended claims.

DETAILED DESCRIPTION

Embodiments of the present invention relate to a method for optimizing loop bandwidth in a delay locked loop. Embodiments of the present invention further relate to a computer system for optimizing loop bandwidth in a delay locked loop. Embodiments of the present invention also relate to a program executed on a computer for optimizing loop bandwidth in a delay locked loop.

Figure 1:
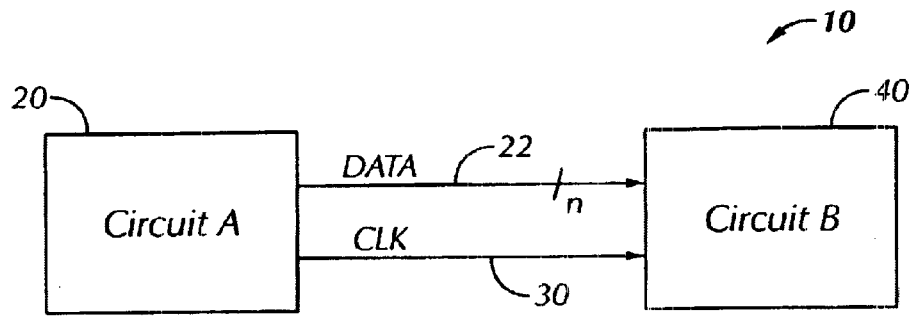
FIG. 1 shows a typical computer system component.
Figure 2:
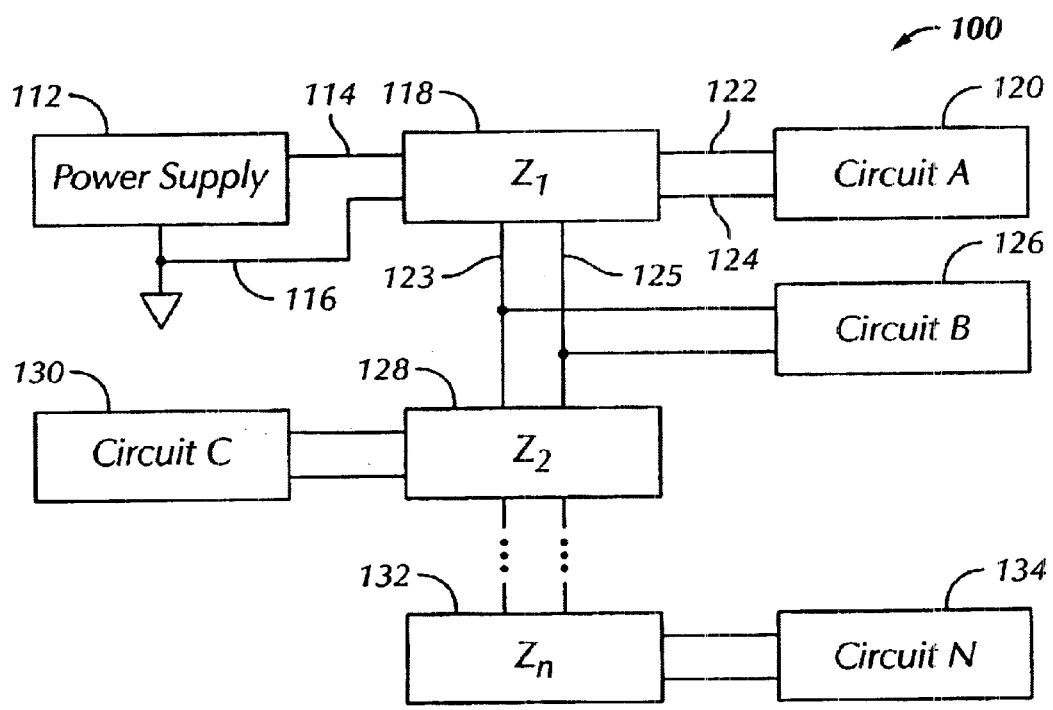
FIG. 2 shows a typical computer system power supply network.

In FIG. 2, the impedance networks (118, 128, 132) may be very complex arrangements of passive elements. The impedances may be the result of, but not limited to, a power supply connection, bulk capacitors, printed circuit board planes, printed circuit board vias, ceramic capacitors, printed circuit board to chip package connections, chip package planes, chip package vias, chip package capacitors, chip package to chip bump or bond wire connections, chip local and global decoupling capacitors, and switching and non-switching circuit elements. A "chip package" for the purpose of this description of the invention may be any package that allows mounting an integrated circuit to a printed circuit board. An integrated circuit, or die, is also referred to as a "chip" in this description. Also, each of the circuits (120, 126, 130, 134) in FIG. 2 may induce power supply noise on the impedance networks (118, 128, 132). The power supply noise characteristics can result from interactions between the circuits (120, 126, 130, 134) coupled with the impedance networks (118, 128, 132).

For a designer to adequately examine the behavior of the power supply noise, a simulation model is desirable. The simulation model is input into a simulation tool so that a computer can calculate the effects of one or more input excitations. One example of a simulation tool is SPICE, which is an acronym for Simulation Program with Integrated Circuit Emphasis. Modeling a complex array of impedances is difficult, however. Furthermore, even if an accurate simulation model is created, the computing overhead necessary to simulate one or more circuits with the impedance model network may be too great.

Figure 3:
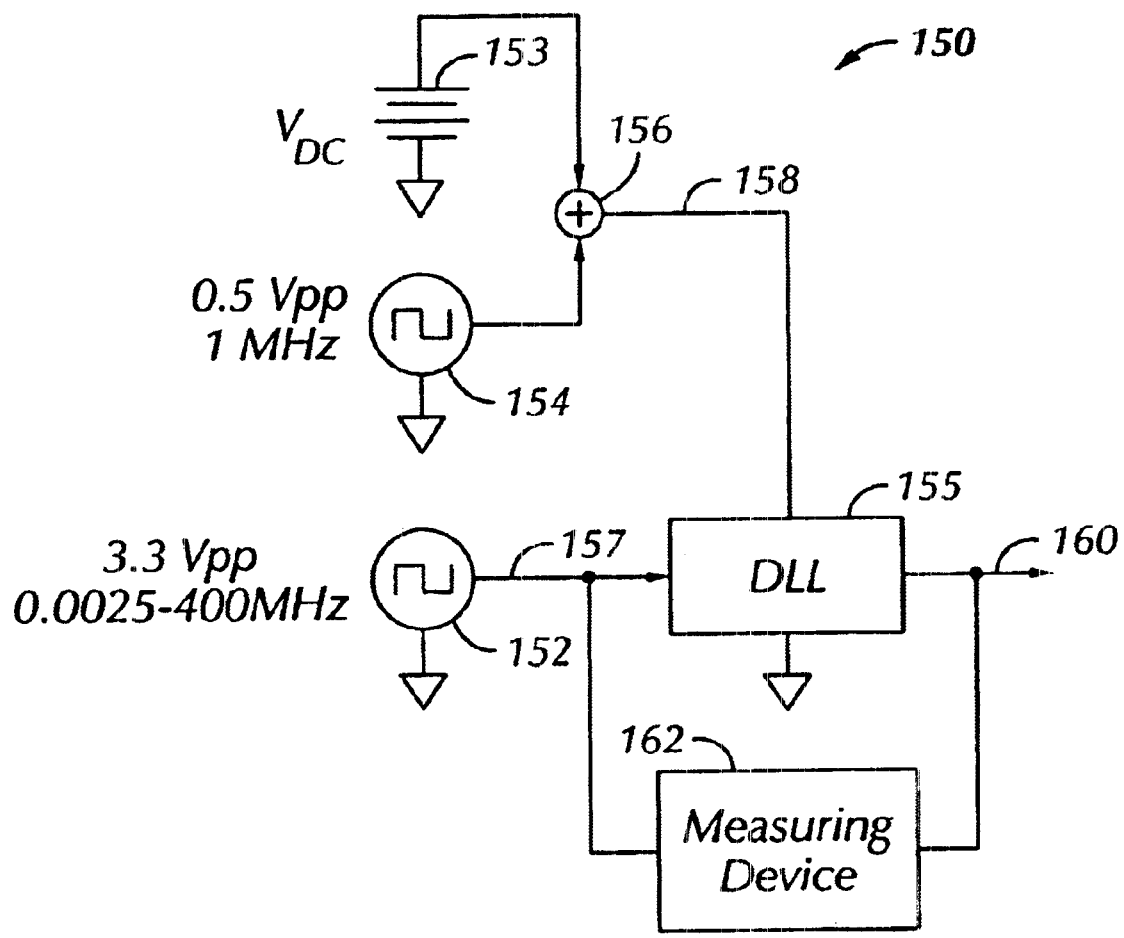
FIG. 3 shows a delay locked loop circuit test arrangement.

In the absence of an accurate model, worst case simulations are often used. In FIG. 3, a test arrangement (150) for a DLL (155) is shown. The DLL (155) is supplied by a DC power supply (153). The DLL (155) has, in this example, a clock input (152) comprising a square wave between 0 V and 3.3 V at a frequency that can be varied between 2.5 kHz and 400 MHz on signal line (157). The DLL output (160) is a delayed copy of the clock input (152). A measuring device (162) measures the timing variations between the clock input (152) and the DLL output (160). Ideally, the delay between the clock input (152) and the DLL output (160) at any single frequency should be constant; however, due to power supply noise, timing variations in the transition from one state to another of the DLL output (160) occur. To model the power supply noise, a square wave generator (154) supplies a 0.5 V peak-to-peak signal that is added to the DC power supply (153) at adder (156). The combined DC power supply (153) and square wave generator (154) output is supplied on power supply line (158) to the DLL (155). The power supply waveform having noise on power supply line (158) creates jitter on the DLL output (160). Temporal shifts and rate of occurrence of the temporal shifts between the clock input (152) and the DLL output (160) are measured by the measuring device (162). The voltage of the DC power supply (153), and frequencies and amplitude of the square wave generator (154) and clock input (152) may be changed to model different operating points.

In FIG. 3, because the noise generated by the square wave generator (154) may exceed typical power supply noise, the jitter on the DLL output (160) may not be representative of actual noise. Reducing the loop bandwidth by adding additional components to filter the jitter may be unnecessary.

Figure 4A:
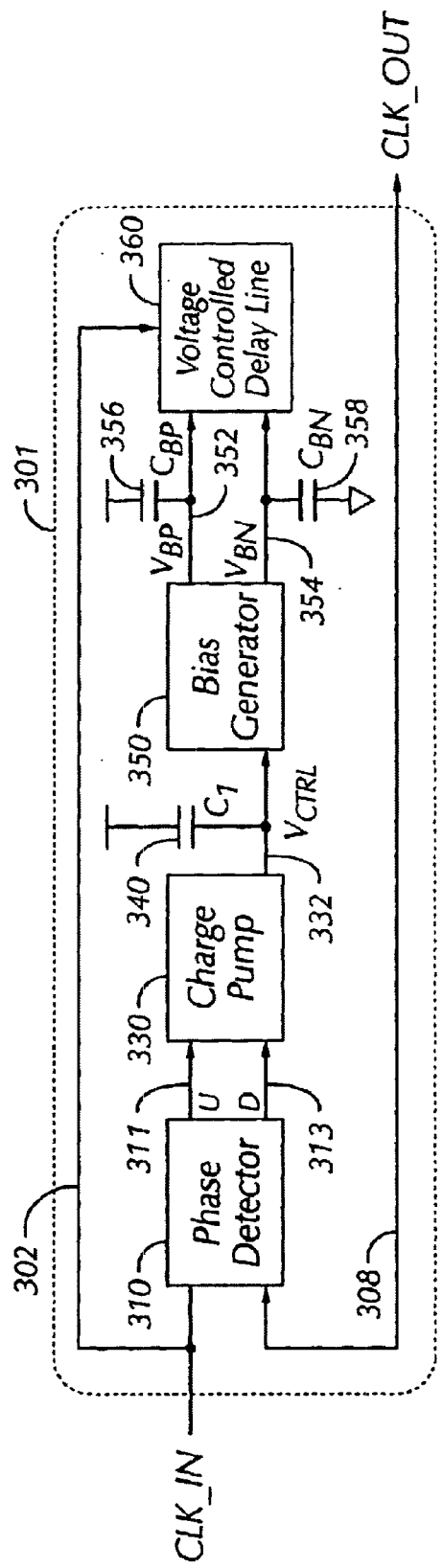
FIG. 4a shows a delay locked loop circuit.

In FIG. 4a, a typical DLL block diagram (301) is shown. The DLL (301) has an input of CLK_IN (302) that is used to create a phased output. CLK_IN (302) is used as an input to a voltage controlled delay line (360) and to a phase detector (310). The phase detector (310) measures whether the phase difference between CLK_IN (302) and an output (384) of the delay path is correct. An adjustment in the phase delay produces signals that control a charge pump, typically up (U) (311) or down (D) (313) pulses. The charge pump (330) adds or removes charge from a capacitor $C_1$ (340), therefore, changing the DC value at the input of the bias generator (350). A DC value input to the biased generator (350) is the control voltage, $V_{CTRL}$ (332). The charge pump (330) adjusts the voltage stored on capacitor $C_1$ (340) between $V_{CTRL}$ (332) and a potential. The bias generator (350) produces the signals $V_{BP}$ (352) and $V_{BN}$ (354) that control the delay of the voltage controlled delay line (360). Because the signals $V_{BP}$ (352) and $V_{BN}$ (354) may be susceptible to power supply noise, additional capacitance may be added, such as capacitors $C_{BP}$ (356) and $C_{BN}$ (358). The voltage controlled delay line (360) may be implemented using current starved elements. This means that the delays are controlled by modifying the amount of current available for charging and discharging capacitances. The linearity of a voltage controlled delay line's characteristics determines the stable range of frequencies over which the delayed lock loop can operate. The output (384) from the voltage controlled delay line (360) provides a phase delayed clock CLK_OUT to other circuits.

Still referring to FIG. 4a, the negative feedback in the loop adjusts the delay through the voltage controlled delay line by integrating the phase error that results between the periodic reference input, CLK_IN (302), and the voltage controlled delay line output (384). The voltage controlled delay line (360) will delay the reference input, CLK_IN (302), by a fixed amount of time to form the output (384) such that there is no detected phase error between the reference input, CLK_IN (302), and the output (384). An increase in capacitance on capacitors such as $C_1$ (340), $C_{BP}$ (356) and/or $C_{BN}$ (358) may reduce the effect of power supply noise on jitter. In other words, with a limited amount of power supply noise, the phase delay between the output (384) compared to the input of CLK_IN (302) remains within specification. The increase in capacitance also reduces the speed at which the DLL can respond to an error in phase between the input of CLK_IN (302) and the output (384). The speed of the DLL response is often related to loop bandwidth.

Figure 4B:
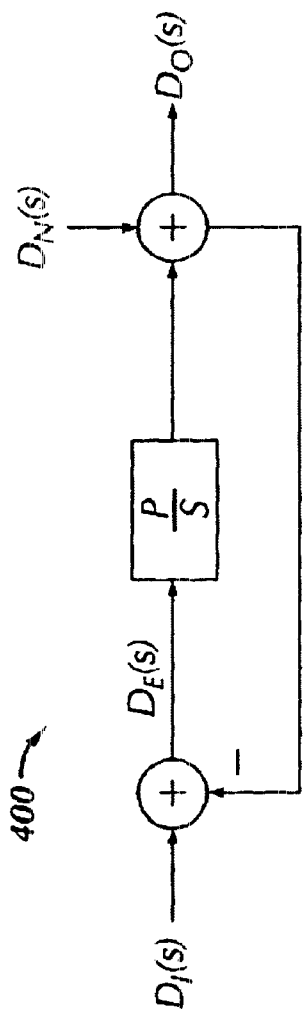
FIG. 4b shows a delay locked loop control diagram.

In FIG. 4b, the frequency response of the DLL may be analyzed with a continuous time approximation, where the sample operation of the phase comparator is ignored. This approximation holds for bandwidths about a decade or more below the operating frequency of the DLL. This bandwidth constraint is also required for stability due to the reduced phase margin near the higher order poles that result from the delay around the sampled feedback loop. The loop filter comprises the charge pump (330), the loop filter capacitors $C_1$ (340), $C_{BP}$ (356) and $C_{BN}$ (358), and the bias generator (350). Because the loop filter integrates the phase error, the DLL has a first-order closed loop response. The response could be formulated in terms of input phase and output phase. This set of variables, however, is incompatible with a continuous time analysis since the sampled nature of the system would need to be considered. A better set of variables is input delay and output delay. The output delay is the delay between the CLK_IN (302) and the DLL output (384), or equivalently, the delay established by the voltage controlled delay line (360). The input delay is the delay to which the phase detector (310) compares the output delay, or equivalently, the phase difference for which the phase detector (310) and charge pump (330) generate no error signal. The output delay, $D_O(s)$, is related to the input delay, $D_I(s)$, by the input-to-output transfer function, $D_O(s)/D_I(s)=1/(1+s/p)$, assuming $D_N(s)=0$. The variable p (in rads/s) is the pole of the loop as determined by the charge pump (330) current, the phase detector (310) and voltage controlled delay line (360) gain, and the capacitors $C_1$ (340), $C_{BP}$ (356) and $C_{BN}$ (358). Similarly, the noise-to-delay error transfer function, assuming $D_I(s)=0$, is $-D_E(s)/DN(s)=(s/p)/(1+s/p)$, where $D_N(s)$ is the additional delay introduced in the loop from supply or substrate noise, and $D_E(s)$ is the delay error seen by the loop phase detector (310). By comparing these two equations, it is clear that as the input-to-output transfer function increases, the noise-to-delay error transfer decreases. In other words, as the effect of jitter caused by power supply noise is decreased in the DLL design, the loop bandwidth is also decreased. Optimizing the DLL loop bandwidth relates to balancing the effect of jitter with the DLL loop's speed of response.

Figure 5A:
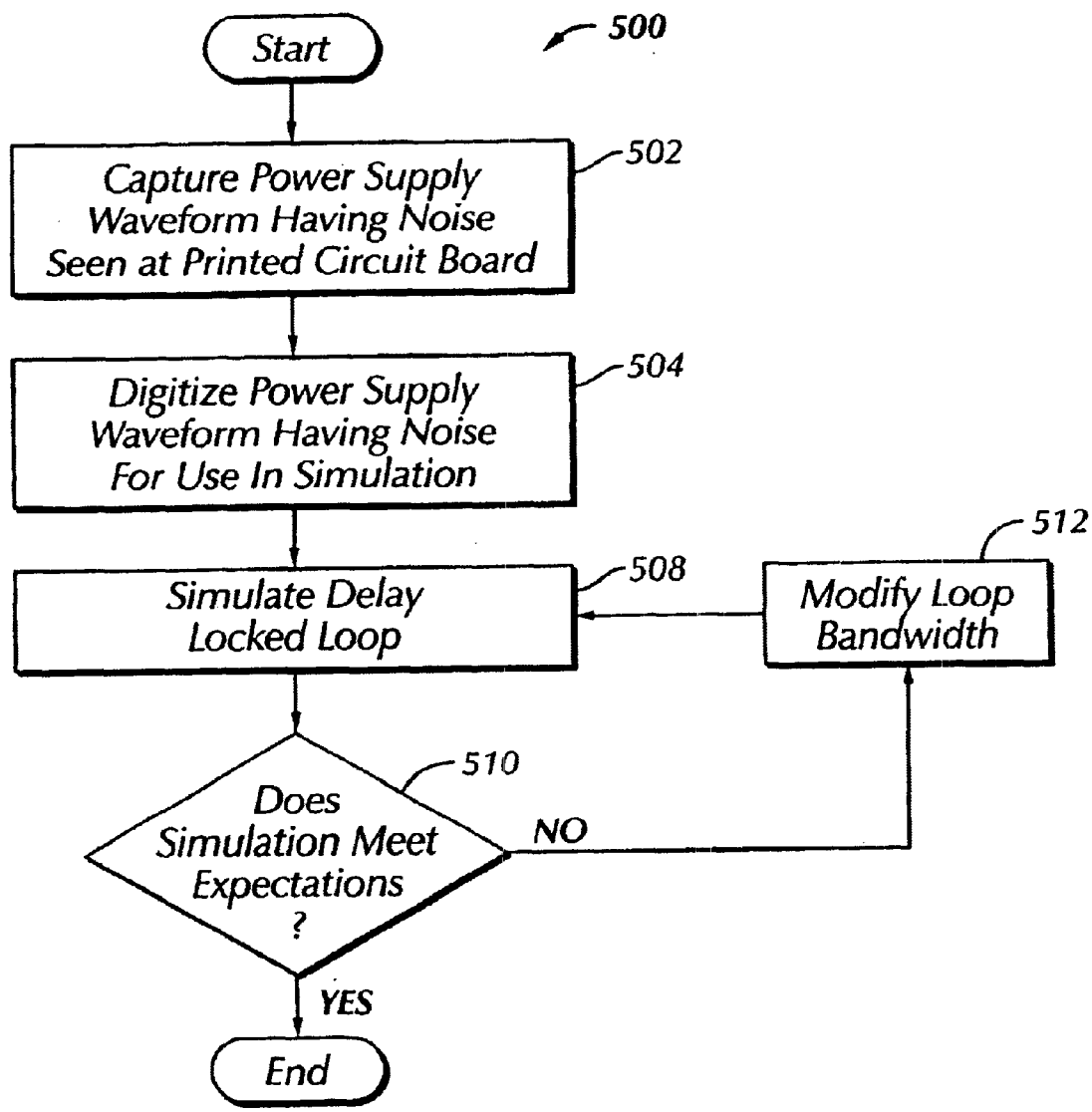
FIG. 5a shows a flow process in accordance with an embodiment of the present invention.

FIG. 5a shows an exemplary flow process (500) in accordance with an embodiment of the present invention. At (502), a power supply waveform having noise is captured. A power supply waveform having noise for the purpose of this description may be any power supply that has deviations from a designed voltage. This power supply waveform is captured at some particular location within a power supply network. Those skilled in the art will appreciate that the noise in the captured power supply waveform comes from a dominant source of noise. A circuit under design does not provide a substantial contribution to the noise in the captured power supply waveform. The power supply waveform having noise may be used to adequately represent a large portion of the power supply network and associated circuitry.

In FIG. 2, for example, circuit C (130) may be the dominant source of noise. The DLL under design may be circuit N (134). By capturing a power supply waveform having noise between impedance networks $Z_2$ (128) and $Z_n$ (132), a system response that represents a large portion of the power supply network and associated circuitry is used. For example, the power supply network and associated circuitry may include the power supply (112), impedance network $Z_1$ (118), circuit A (120), circuit B (126), circuit C (130), and impedance network $Z_2$ (128). Because the dominant source (circuit C (130)) is included in the power supply network and associated circuitry, a simulation using the power supply waveform having noise, impedance network $Z_n$ (132) and circuit N (134) is sufficient.

With regard to simulating a CPU circuit, capturing a power supply waveform on a printed circuit board near the CPU is desirable. The captured power supply waveform will also contain noise as a result of activities on the printed circuit board by one or more circuits. The captured power supply waveform may be the result of physically measuring the voltage on the printed circuit board under operating conditions with measuring equipment. These operating conditions may include extreme conditions in an effort to capture a worst case power supply waveform having noise. These operating conditions may be the result of varying one or more of the following: temperature, voltage, frequency, and manufacturing process. The captured power supply waveform may also be the result of a simulation of some portion of the power supply network. For the purposes of this description of the invention, a representative power supply waveform comprises an approximation of an actual power supply waveform as occurs in a realistic system. By capturing the power supply waveform at an intermediate point in the power supply network, a division in design responsibilities and expertise is achieved. A power supply network designer may focus on design and simulation of a portion of the power supply network while a circuit designer may capture representative power supply signals at an appropriate location to be used as an input to their circuits.

The captured power supply waveform is digitized at (504) to be input to a simulation program. The digitization may be a direct point by point representation. The digitization may also be a representative model of the waveform that may include a formulated representation in which an equation characterizes the power supply waveform having noise. At (508), the DLL under design is simulated using the digitized power supply waveform having noise captured from the printed circuit board at (504). At (508), the computational overhead of the simulation is reduced due to the input of the power supply waveform having noise being used instead of a portion of the power supply network that may contain a large number of elements. Also, the simulation of the DLL at (508) is more accurate because the digitized power supply waveform having noise is used instead of a pessimistic estimate.

As the results of the simulation are analyzed, a decision is made in (510) as to whether the results meet expectations. At (510), the results of the simulation must meet specifications; however, the designer may have guard band or design goal expectations that improve upon the specification. For example, the amount of jitter may be compared against a specification. If the expectations are not met, (512) is followed to modify the design and/or the loop bandwidth. (508), (510), and (512) are repeated until a satisfactory result occurs. For example, the loop bandwidth may be simulated until it is optimized based on the amount of jitter meeting or improving upon specifications.

Figure 5B:
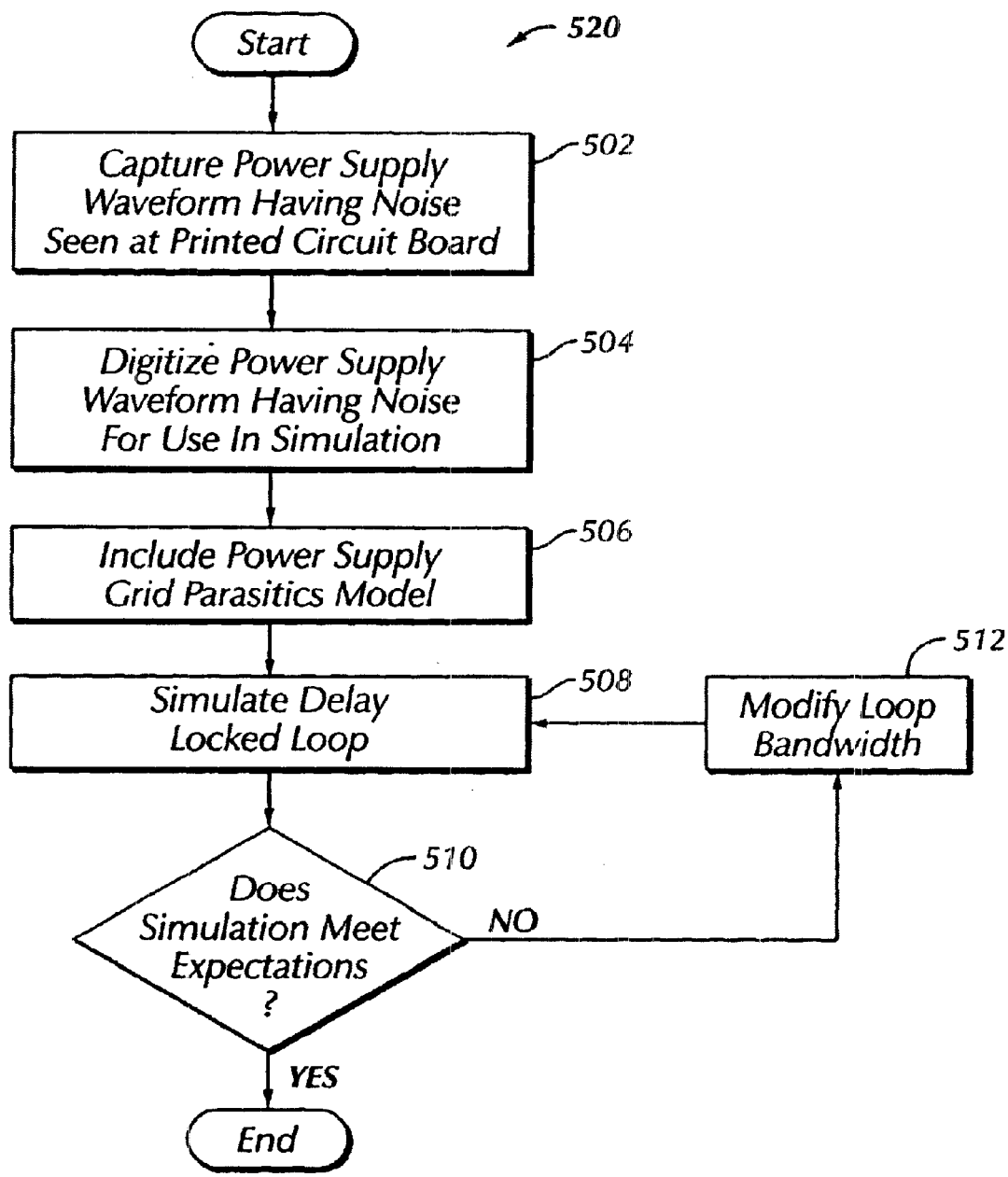
FIG. 5b shows a flow process in accordance with another embodiment of the present invention.

In FIG. 5b, an exemplary flow process (520) in accordance with another embodiment of the present invention is shown. At (502), a power supply waveform having noise, as described previously, is captured. The captured power supply waveform is digitized at (504), as described previously, to be input to a simulation program. Capturing and digitizing the power supply waveform does not preclude the addition of circuits to model another portion of the power supply network not represented in the captured and digitized power supply waveform. This additional portion of the power supply network may be used between the captured power supply waveform and the circuit under design. At (506), elements may be added to the simulation to represent additional power supply network components. For example, a captured power supply signal may be captured on a printed circuit board; however, the circuit to be designed resides on an integrated circuit. At (506), the power supply network elements that may be added include, but are not limited to, connections (parasitics) between the printed circuit board and chip package, connections (parasitics) between the chip package and chip, and connections (parasitics) between the chip power supply network and circuit under design. These added elements may improve the modeling of the actual passive parasitics. At (508), the DLL under design is simulated using the digitized power supply waveform having noise captured from the printed circuit board at (504) and the parasitics from (506). At (508), the computational overhead of the simulation is reduced due to the input of the power supply waveform having noise being used instead of a portion of the power supply network that may contain a large number of elements. Also, the simulation of the DLL at (508) is more accurate because the digitized power supply waveform having noise is used instead of a square wave.

As the results of the simulation are analyzed, a decision is made in (510) as to whether the results meet expectations. At (510), the results of the simulation must meet specifications; however, the designer may have guard band or design goal expectations that improve upon the specification. For example, the amount of jitter may be compared against a specification. If the expectations are not met, (512) is followed to modify the design and/or the loop bandwidth. (508), (510), and (512) are repeated until a satisfactory result occurs. For example, the loop bandwidth may be simulated until it is optimized based on the amount of jitter meeting or improving upon specifications.

Those skilled in the art will appreciate that the captured power supply waveform having noise may be obtained from probing a physical system, such as a printed circuit board, chip package, or chip, under various operating conditions. Operating conditions include, but are not limited to, temperature, voltage, frequency, and manufacturing (process) variations. Those skilled in the art will also appreciate that the captured power supply waveform having noise may be obtained from probing an integrated circuit under various operating conditions. Furthermore, those skilled in the art will appreciate that the power supply waveform having noise obtained from a physical system may be obtained from a location adjacent to an intended location of the DLL under various operating conditions. Those skilled in the art will further appreciate that using the power supply waveform having noise in place of a portion of the power supply network reduces the computational load when simulating the circuit.

Those skilled in the art will appreciate that the captured power supply signal having noise may be obtained from simulation data of a modeled printed circuit board's parasitics under various operating conditions. Furthermore, those skilled in the art will appreciate that the captured power supply waveform having noise may be obtained from simulation data of a power supply network's parasitics that may include, but is not limited to, the motherboard power supply network, motherboard to integrated circuit connections, and/or integrated circuit power supply network under various operating conditions. Operating conditions include, but are not limited to, temperature, voltage, frequency, and manufacturing (process) variations. Those skilled in the art will further appreciate that the simulation of the circuit using the power supply waveform having noise may be dependent on various operating conditions. Those skilled in the art will also appreciate that the simulation tool used to simulate the power supply waveform having noise does not have to be the same simulation tool used to simulate the circuit using the power supply waveform having noise.

Those skilled in the art will appreciate that capturing the power supply signal having noise, whether from a physical system or simulation, may advantageously be obtained adjacent to an intended location of the DLL.

Those skilled in the art will appreciate that the noise may be captured separately from the power supply waveform and combined to create the power supply waveform having noise.

Those skilled in the art will appreciate that multiple power supply waveforms having noise may be used simultaneously, and the multiple power supply waveforms having noise may be connected to different locations on the power supply network. Those skilled in the art will further appreciate that the DLL and additional circuits may be used in the simulation at (508).

Those skilled in the art will appreciate that the DLL may be analog, digital, or a combination of both types of circuits.

Figure 6:
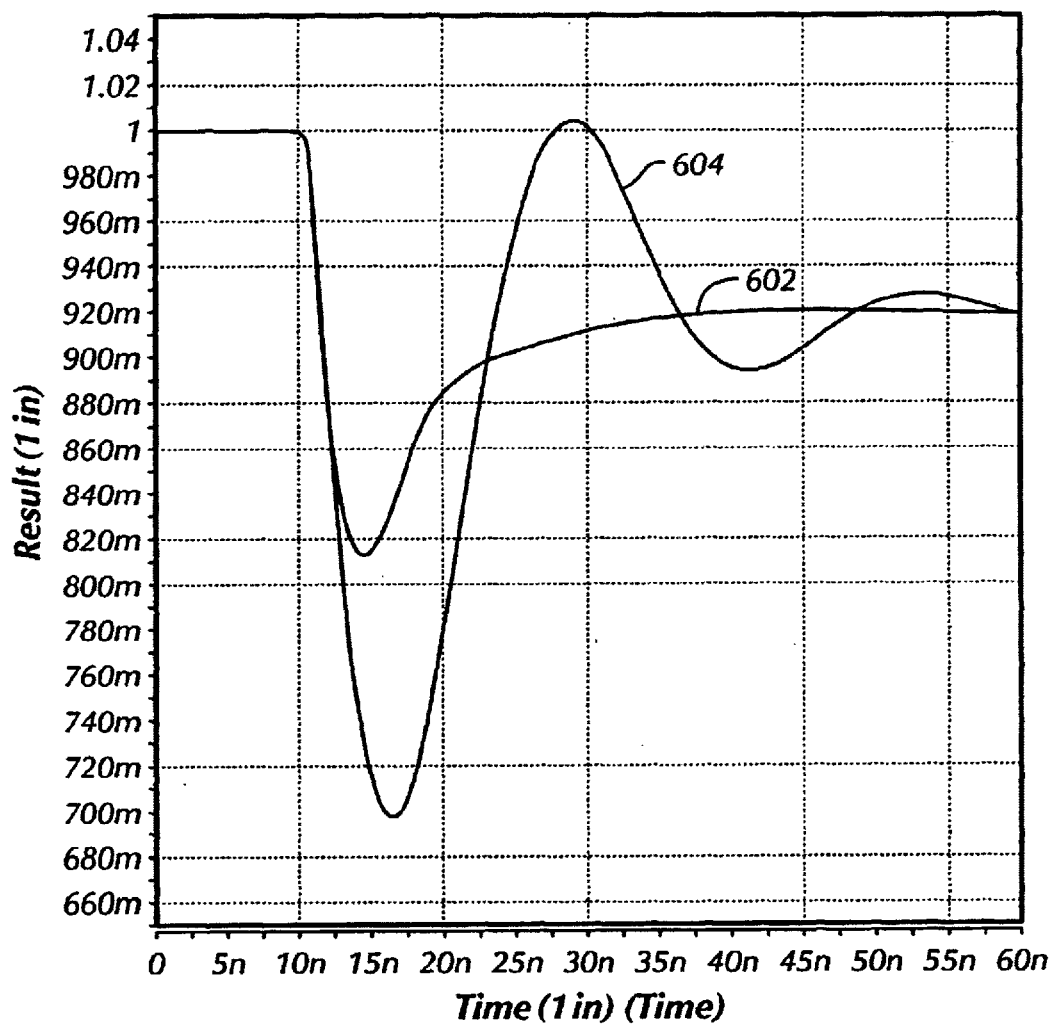
FIG. 6 shows captured power supply waveforms in accordance with another embodiment of the present invention.

In FIG. 6, two captured power supply waveforms having noise (602, 604), in accordance with various embodiments of the present invention, are shown. Both captured power supply waveforms start at time zero at approximately 1 V. At 10 ns, one or more circuits interacting with one or more impedance networks create noise on the power supply waveforms. For power supply waveform (602), the effect is reduced compared to power supply waveform (604). Depending on the needs of a circuit designer, either power supply waveform (602, 604) can be digitized or modeled, and operatively used as the power supply input to the circuit simulation.

Those skilled in the art will appreciate that power supply waveform (602) and power supply waveform (604) may have been captured under different operating conditions. Those skilled in the art will further appreciate that power supply waveform (602) and power supply waveform (604) may have been captured at different locations within the power supply network.

Figure 7:
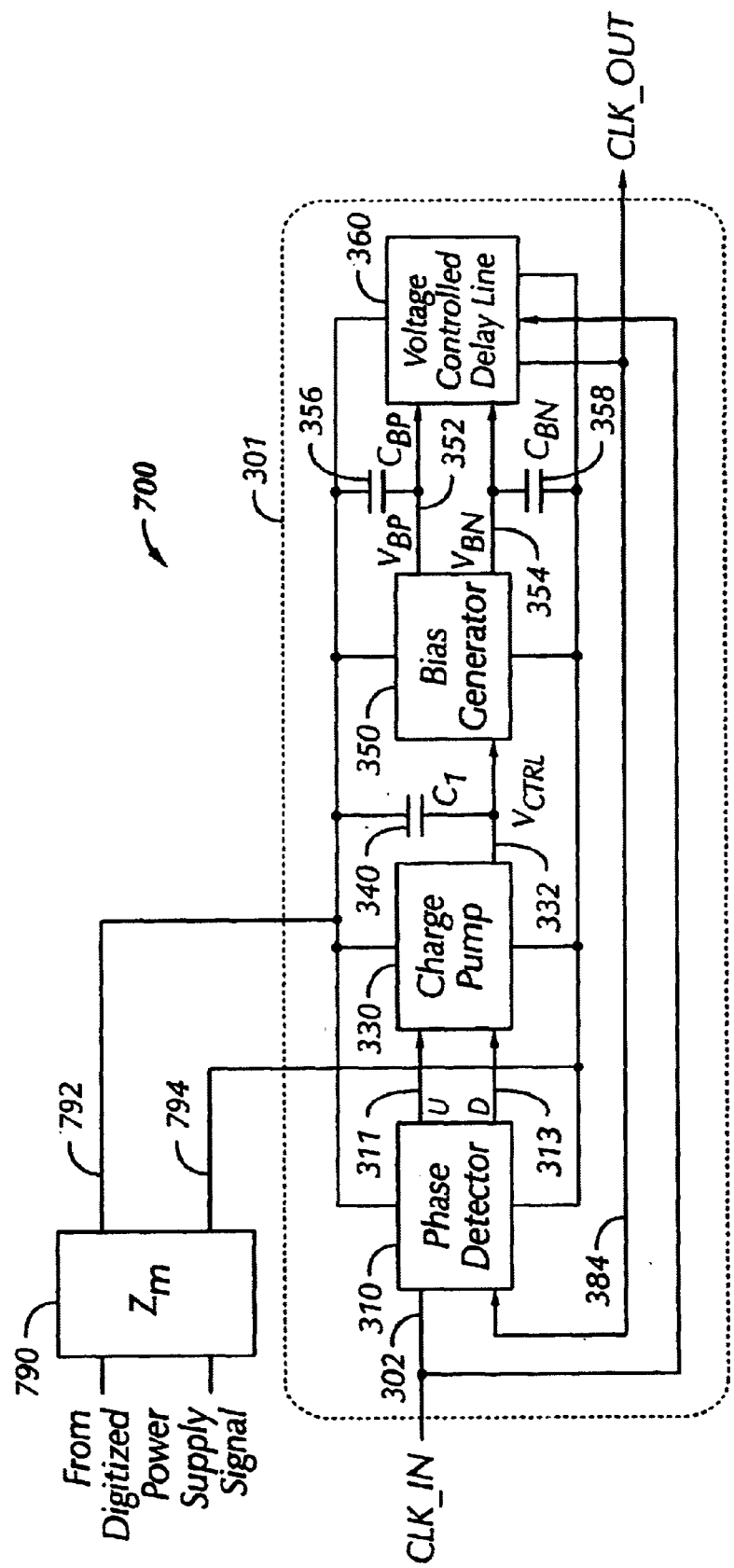
FIG. 7 shows a delay locked loop circuit in accordance with another embodiment of the present invention.

FIG. 7 shows an exemplary circuit (700) in accordance with another embodiment of the present invention. A block diagram drawing of a DLL (301) is shown. The DLL (301) has an input of CLK_IN (302) that is used to create a phased output. CLK_IN (302) is used as an input to a voltage controlled delay line (360) and to a phase detector (310). The phase detector (310) measures whether the phase difference between CLK_IN (302) and an output (384) of the delay path is correct. An adjustment in the phase delay produces signals that control a charge pump, typically up (U) (311) or down (D) (313) pulses. The charge pump (330) adds or removes charge from capacitor $C_1$ (340), changing the DC value, $V_{CTRL}$ (332), at the input of the bias generator (350). The bias generator (350) produces the signals $V_{BP}$ (352) and $V_{BN}$ (354) that control the delay of the voltage controlled delay line (360). Capacitors $C_{BP}$ (356) and $C_{BN}$ (358) help maintain the voltage on $V_{BP}$ (352) and $V_{BN}$ (354), respectively. The voltage controlled delay line (360) may be implemented using current starved elements. This means that the delays are controlled by modifying the amount of current available for charging and discharging capacitances. The linearity of a voltage controlled delay line's characteristics determines the stable range of frequencies over which the delayed lock loop can operate. The output (384) from the voltage controlled delay line (360) provides a phase delayed clock CLK_OUT to other circuits.

Still referring to FIG. 7, a power supply waveform having noise has been determined from a power supply network and digitized. The power supply waveform having noise is operatively used either through direct digitization or appropriate modeling such as a formulated representation where an equation describes the signal's characteristics. The power supply waveform having noise is input to an impedance network $Z_M$ (790). The impedance network $Z_M$ (790) supplies power to the DLL (301) through power supply line (792) and ground line (794). Simulating the DLL (301) with the representation of the power supply waveform having noise provides a technique to estimate jitter.

Jitter represents the perturbations that result in the intermittent shortening or lengthening of signal elements. For example, a steady clock input may be used as an input of CLK_IN (302) to the DLL (301). A piece-wise linear representation of the power supply waveform having noise, for example power supply waveform having noise (602) (in FIG. 6), may be used to supply the impedance network $Z_M$ (790). The power supply waveform having noise (602) may be acquired from a simulation of a printed circuit board. The impedance network $Z_M$ (790) represents additional impedances between the printed circuit board and the DLL (301) that is located on an integrated circuit. The power supply waveform having noise may disturb the output (384) from the voltage controlled delay line (360). Variations between the transition from one state to another state between the input of CLK_IN (302) to the DLL (301) and the output (384) from the voltage controlled delay line (360) represent jitter. Optimization of the loop bandwidth may be based on jitter using the power supply waveform having noise. Because a realistic power supply waveform having noise is used, the DLL will not be over designed with respect to loop bandwidth. Also, the simulation can be completed in a reasonable amount of time; therefore, the DLL design and/or the loop bandwidth elements may be modified in an iterative fashion to improve the system's performance.

Those skilled in the art will appreciate that a computer system is described for determining a representation of a power supply waveform having noise, using that representation to simulate a delay locked loop, and estimating jitter in the delay locked loop to optimize loop bandwidth.

Those skilled in the art will appreciate that a computer-readable medium having recorded thereon instructions executable by a processor is described to determine a representation of a power supply waveform having noise, using that representation to simulate a delay locked loop, and estimating jitter in the delay locked loop to optimize loop bandwidth.

Advantages of the present invention may include one or more of the following. In some embodiments, because a representation of a power supply signal having noise is used, a more accurate circuit simulation may be performed. Realistic results help alleviate costly over design. A circuit designed with more accurate power supply waveforms may require a reduced amount of chip area. The space saved due to the reduced chip area may be used for additional performance enhancing circuits, or may be used to reduce the final chip size, hence cost.

In some embodiments, because a representation of a power supply signal having noise is used, a circuit simulation that requires less computational load may be performed. Accordingly, more iterations in the design process may be afforded.

In some embodiments, because a representation of a power supply signal having noise is used, tasks involved with designing a power supply network and individual circuits may be advantageously divided and performed by experts in their respective areas of expertise.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for optimizing a loop bandwidth in a delay locked loop, comprising:
   inputting a digitized representative power supply waveform having noise to a simulation of the delay locked loop;
   estimating jitter of the delay locked loop;
   adjusting the loop bandwidth of the delay locked loop; and
   repeating the inputting, estimating, and adjusting until the jitter falls below a selected amount.

2. The method of claim 1, wherein adjusting the loop bandwidth comprises adjusting a loop filter capacitor.

3. The method of claim 1, wherein the representative power supply waveform is obtained from a physical system.

4. The method of claim 3, wherein the physical system comprises a printed circuit board.

5. The method of claim 3, wherein the physical system comprises a chip package.

6. The method of claim 3, wherein the physical system comprises a chip.

7. The method of claim 1, wherein the representative power supply waveform is obtained from a location on a physical system adjacent to an intended location of the delay locked loop.

8. The method of claim 1, wherein the representative power supply waveform is obtained from a power supply simulation.

9. The method of claim 8, wherein the power supply simulation is performed using a first simulation tool and the simulation of the delay locked loop is performed using a second simulation tool.

10. The method of claim 1, wherein the representative power supply waveform comprises a noise waveform combined with a power supply waveform.

11. The method of claim 1, wherein the representative power supply waveform is dependent on at least one selected from the group consisting of temperature, voltage, frequency, and manufacturing process.

12. The method of claim 1, wherein the simulation of the delay locked loop is dependent on at least one selected from the group consisting of temperature, voltage, frequency, and manufacturing process.

13. A computer system for optimizing a loop bandwidth in a delay locked loop, comprising:

a processor;

a memory; and software instructions stored in the memory adapted to cause the computer system to:
input a digitized representative power supply waveform having noise into a simulation of the delay locked loop;
estimate jitter of the delay locked loop;
adjust the loop bandwidth of the delay locked loop; and
repeat the input, estimate, and adjust until the jitter falls below a selected amount.

14. The computer system of claim 13, wherein adjusting the loop bandwidth comprises adjusting a loop filter capacitor.

15. The computer system of claim 13, wherein the representative power supply waveform is from a physical system.

16. The computer system of claim 15, wherein the physical system comprises a printed circuit board.

17. The computer system of claim 15, wherein the physical system comprises a chip package.

18. The computer system of claim 15, wherein the physical system comprises a chip.

19. The computer system of claim 13, wherein the representative power supply waveform is obtained from a location on a physical system adjacent to an intended location of the delay locked loop.

20. The computer system of claim 13, wherein the representative power supply waveform is obtained from a power supply simulation.

21. The computer system of claim 20, wherein the power supply simulation is performed using a first simulation tool and the simulation of the delay locked loop is performed using a second simulation tool.

22. The computer system of claim 13, wherein the representative power supply waveform comprises a noise waveform combined with a power supply waveform.

23. The computer system of claim 13, wherein the representative power supply waveform is dependent on at least one selected from the group consisting of temperature, voltage, frequency, and manufacturing process.

24. The computer system of claim 13, wherein the simulation of the delay locked loop is dependent on at least one selected from the group consisting of temperature, voltage, frequency, and manufacturing process.

25. A computer-readable medium having recorded thereon instructions executable by a processor, the instructions adapted to:
input a digitized representative power supply waveform having noise into a simulation of a delay locked loop;
estimate jitter of the delay locked loop;
adjust the loop bandwidth of the delay locked loop; and
repeat the input, estimate, and adjust until the jitter falls below a selected amount.

26. The computer-readable medium of claim 25, wherein adjusting the loop bandwidth comprises adjusting a loop filter capacitor.

27. The computer-readable medium of claim 25, wherein the representative power supply waveform is determined from a physical system.

28. The computer-readable medium of claim 27, wherein the physical system comprises a printed circuit board.

29. The computer-readable medium of claim 27, wherein the physical system comprises a chip package.

30. The computer-readable medium of claim 27, wherein the physical system comprises a chip.

31. The computer-readable medium of claim 25, wherein the representative power supply waveform is obtained from a location on a physical system adjacent to an intended location of the delay locked loop.

32. The computer-readable medium of claim 25, wherein the representative power supply waveform is obtained from a power supply simulation.

33. The computer-readable medium of claim 32, wherein the power supply simulation is performed using a first simulation tool and the simulation of the delay locked loop is performed using a second simulation tool.

34. The computer-readable medium of claim 25, wherein the representative power supply waveform comprises a noise waveform combined with a power supply waveform.

35. The computer-readable medium of claim 25, wherein the representative power supply waveform is dependent on at least one selected from the group consisting of temperature, voltage, frequency, and manufacturing process.

36. The computer-readable medium of claim 25, wherein the simulation of the delay locked loop is dependent on at least one selected from the group consisting of temperature, voltage, frequency, and manufacturing process.

* * * * *

UNITED STATES PATENT AND TRADEMARK OFFICE
CERTIFICATE OF CORRECTION

PATENT NO. : 6,687,881 B2
DATED : February 3, 2004
INVENTOR(S) : Claude Gauthier et al.

It is certified that error appears in the above-identified patent and that said Letters Patent is hereby corrected as shown below:

<u>Title page,</u>
Item [57], ABSTRACT,
Line 5, replace "looked" with -- locked --.

Signed and Sealed this

Fifteenth Day of June, 2004

JON W. DUDAS
*Acting Director of the United States Patent and Trademark Office*